United States Patent
Yoshikawa

(10) Patent No.: US 8,134,383 B2
(45) Date of Patent: Mar. 13, 2012

(54) LSI TEST APPARATUS, LSI TEST METHOD, AND COMPUTER PRODUCT

(75) Inventor: Satoru Yoshikawa, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 412 days.

(21) Appl. No.: 12/525,427

(22) PCT Filed: Feb. 20, 2007

(86) PCT No.: PCT/JP2007/053059
§ 371 (c)(1),
(2), (4) Date: Jul. 31, 2009

(87) PCT Pub. No.: WO2008/102433
PCT Pub. Date: Aug. 28, 2008

(65) Prior Publication Data
US 2010/0090705 A1   Apr. 15, 2010

(51) Int. Cl.
*G01R 31/26* (2006.01)

(52) U.S. Cl. .................... 324/762.01; 324/73.1

(58) Field of Classification Search .................... None
See application file for complete search history.

(56) References Cited

U.S. PATENT DOCUMENTS

| 6,028,983 A * | 2/2000 | Jaber ............................. 714/30 |
| 2008/0104554 A1* | 5/2008 | Kobayashi et al. ............... 716/4 |

FOREIGN PATENT DOCUMENTS

| JP | 2003-085233 A | 3/2003 |
| JP | 2004-286549 A | 10/2004 |
| JP | 2005-050030 A | 2/2005 |
| JP | 2006-038831 A | 2/2006 |
| JP | 2006-066825 A | 3/2006 |

OTHER PUBLICATIONS

Hiroyasu Hasegawa. "Guideline for Lower Power Consumption", Design Wave Magazine, Jul. 2002, pp. 111-1165.

* cited by examiner

*Primary Examiner* — Minh N Tang
(74) *Attorney, Agent, or Firm* — Arent Fox LLP

(57) ABSTRACT

An LSI test apparatus includes a test circuit synthesizing unit that synthesizes a test circuit and inserts the test circuit in a pre-test-synthesis net list; a test pattern generating unit that, based on a post-test-synthesis net list acquired by the test circuit synthesizing unit, generates a test pattern that simultaneously activates selected gated clock buffers; a simulating unit that, using the test pattern generated by the test pattern generating unit, simulates operation of a circuit created from the post-test-synthesis net list; and a power source analyzing unit that analyzes voltage drop in terms of amount, based on operation rate information acquired by the simulating unit.

10 Claims, 11 Drawing Sheets

| TEST MODE SIGNAL | SCAN MODE SIGNAL | FF OUTPUT | OR OUTPUT | SELECTOR OUTPUT |
|---|---|---|---|---|
| 0 | * | * | * | ENABLE CONTROL CIRCUIT OUTPUT SIGNAL |
| 1 | 1 | * | 1 | 1 |
| 1 | 0 | 1 | 1 | 1 |
| 1 | 0 | 0 | 0 | 0 |

FIG.7

| TEST MODE SIGNAL | SCAN MODE SIGNAL | COUNTER OUTPUT (3 BITS) | DECODER OUTPUT (8 BITS) | SELECTOR OUTPUT (GROUP 8 TO GROUP 1) |
|---|---|---|---|---|
| 0 | * | * | * | ENABLE CONTROL CIRCUIT OUTPUT SIGNAL |
| 1 | 1 | 000 | 11111111 | 11111111 |
| 1 | 0 | 000 | 00000001 | 00000001 |
| 1 | 0 | 001 | 00000010 | 00000010 |
| 1 | 0 | 010 | 00000100 | 00000100 |
| 1 | 0 | 011 | 00001000 | 00001000 |
| 1 | 0 | 100 | 00010000 | 00010000 |
| 1 | 0 | 101 | 00100000 | 00100000 |
| 1 | 0 | 110 | 01000000 | 01000000 |
| 1 | 0 | 111 | 10000000 | 10000000 |

LSI TEST APPARATUS, LSI TEST METHOD, AND COMPUTER PRODUCT

FIELD

The embodiments discussed herein are related to an LSI test apparatus, an LSI test method, and computer product.

BACKGROUND

In conducting a test on a large-scale integrated circuit (LSI) chip, a high-speed test (transition delay test (TDT)) executed at LSI system operation speed has been demanded in addition to stuck-fault tests. Typically, a gated clock technique is employed to stop an LSI from supplying a clock signal to a circuit block that does not need to operate at the time of system operation (user mode operation).

FIG. 11 depicts a circuit configuration of an LSI before test synthesis. As depicted in FIG. 11, the circuit 1 of the LSI includes multiple gated clock buffers 2a and 2b, a phase-locked loop (PLL) circuit 3 that supplies a clock signal to each of the gated clock buffers 2a and 2b, multiple circuit blocks 6a and 6b each of which is supplied with a clock signal from the gated clock buffers 2a and 2b and has a flip-flop 4 and a memory 5, and enable control circuits (EN Logic) 7 respectively controlling the gated clock buffers 2a and 2b.

In the configuration depicted in FIG. 11, for example, when one circuit block 6a operates while another circuit block 6b does not operate at the time of system operation, the gated clock buffer 2a connected to the operating circuit block 6a supplies the clock signal to the circuit block 6a while the gated clock buffer 2b connected to the non-operating circuit block 6b stops the supply of the clock signal to the circuit block 6b.

FIG. 12 depicts a circuit configuration of an LSI after test synthesis performed according to a conventional test method. As depicted in FIG. 12, a design for test (DFT) controller 8, mask circuits 9, and a selector 10 for PLL bypass are incorporated in the circuit 1 of the LSI as a result of the test synthesis. Each mask circuit 9 is interposed between an enable control circuit 7 and an enable control terminal EN of each of the gated clock buffers 2a and 2b. When a test is conducted, the DFT controller 8 keeps all mask circuits 9 in an active state. As a result, the flip-flops 4 and the memories 5 of all the circuit blocks 6a and 6b are constantly supplied a clock signal, which means that the entire LSI operates substantially at the same time.

A semiconductor integrated circuit having a scan test circuit is known as an integrated circuit utilizing the gated clock technique. For example, the semiconductor integrated circuit includes a logic circuit, a flip-flop circuit that receives a signal output from the logic circuit and synchronized with a clock signal, and a mask circuit that generates a clock stopping signal for stopping supply of the clock signal to the flip-flop circuit. The semiconductor integrated circuit has a function of scan testing in which a scan path is formed by the logic circuit and the flip-flop circuit. In a normal operation mode, the mask circuit stops the supply of the clock signal to the flip-flop circuit. In a scan test mode, the supply of the clock signal to the flip-flop circuit is enabled regardless of the operation of the mask circuit, so that the flip-flop circuit forms a scan path for a scan test on the mask circuit (see Japanese Laid-Open Patent Publication No. 2006-38831).

As described, an entire LSI operates substantially simultaneously in a test according to a conventional test method and operates at higher speed in a high-speed test. Because of this, power consumption at the time of testing becomes greater than power consumption at the time of system operation, which may result in a large voltage drop. Usually, power supply design for the LSI is determined with consideration of the amount of voltage drop occurring during system operation, etc., so that the LSI operates trouble-free at the time of system operation. This leads to a problem in that if a voltage drop larger than a voltage drop occurring during system operation occurs during a high-speed test, the high-speed test cannot be conducted.

SUMMARY

According to an aspect of the present invention, an LSI test apparatus includes a test circuit synthesizing unit that synthesizes a test circuit and inserts the test circuit in a pre-test-synthesis net list; a test pattern generating unit that, based on a post-test-synthesis net list acquired by the test circuit synthesizing unit, generates a test pattern that simultaneously activates selected gated clock buffers; a simulating unit that, using the test pattern generated by the test pattern generating unit, simulates operation of a circuit created from the post-test-synthesis net list; and a power source analyzing unit that analyzes voltage drop in terms of amount, based on operation rate information acquired by the simulating unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a schematic of an example of a truth table for test circuits in the circuit configuration depicted in FIG. 6;

DESCRIPTION OF EMBODIMENTS

Preferred embodiments of the present invention will be explained with reference to the accompanying drawings.

Figure 1:
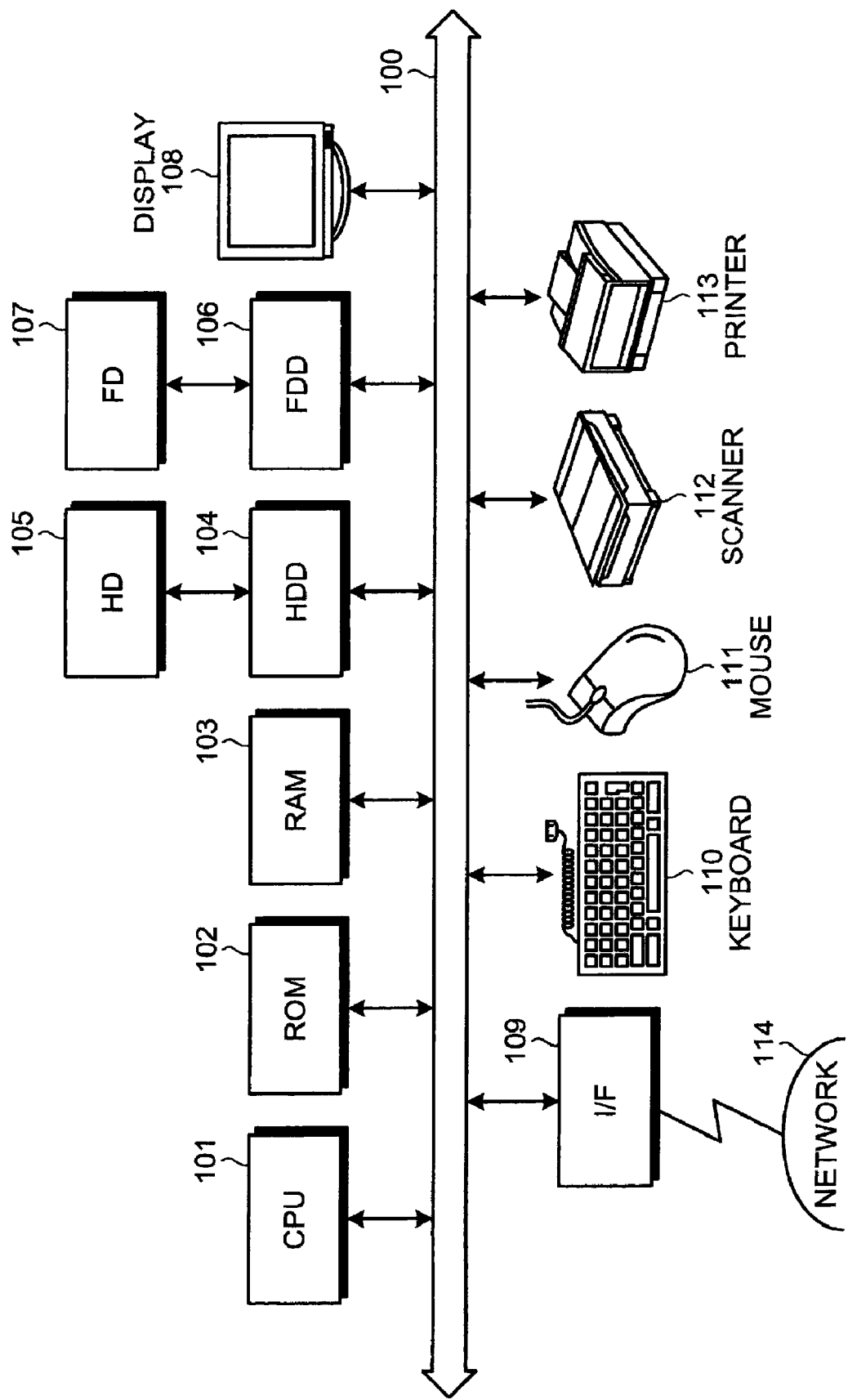
FIG. 1 is a block diagram of an LSI test apparatus according to an embodiment.

FIG. 1 is a block diagram of an LSI test apparatus according to an embodiment.

As depicted in FIG. 1, the LSI test apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removal recording medium, a display 108, an interface (I/F) 109, a keyboard 110, a mouse 111, a scanner 112, and a printer 113, connected to one another by way of a bus 100.

The CPU 101 governs overall control of the LSI test apparatus. The ROM 102 stores therein programs such as a boot program. The RAM 103 is used as a work area of the CPU 101. The HDD 104, under the control of the CPU 101, controls the reading and writing of data with respect to the HD 105. The HD 105 stores therein the data written under control of the HDD 104.

The FDD 106, under the control of the CPU 101, controls the reading and writing of data with respect to the FD 107. The FD 107 stores therein the data written under control of the FDD 106, the data being read by the LSI test apparatus.

In addition to the FD 107, a removable recording medium may include a compact disk read-only memory (CD-ROM), compact disk-recordable (CD-R), a compact disk-rewritable (CD-RW), a magneto optical disk (MO), a Digital Versatile Disk (DVD), and a memory card. The display 108 displays a cursor, an icon, a tool box, and data such as document, image, and function information. The display 108 may be, for example, a cathode ray tube (CRT), a thin-film-transistor (TFT) liquid crystal display, or a plasma display.

The I/F 109 is connected to a network 114 such as the Internet through a telecommunications line and is connected to other devices by way of the network 114. The I/F 109 administers an internal interface with the network 114, and controls the input and output of data with respect to external devices. The I/F 109 may be, for example, a modem or a local area network (LAN) adapter.

The keyboard 110 is equipped with keys for the input of characters, numerals, and various instructions, and data is entered through the keyboard 110. The keyboard 110 may be a touch-panel input pad or a numeric keypad. The mouse 111 performs cursor movement, range selection, and movement, size change, etc., of a window. The mouse 111 may be a trackball or a joystick provided the trackball or joystick has similar functions as a pointing device.

The scanner 112 optically reads an image and takes in the image data into the LSI test apparatus. The scanner 112 may have an optical character recognition (OCR) function. The printer 113 prints image data and document data. The printer 113 may be, for example, a laser printer or an ink jet printer.

Figure 2:
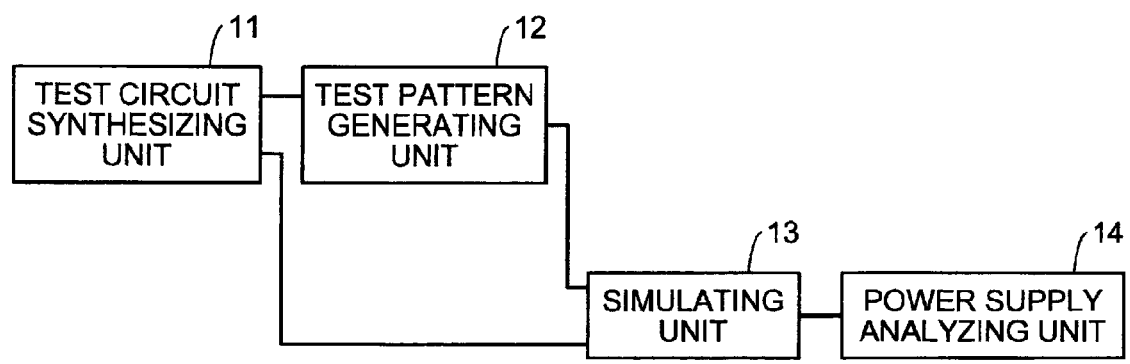
FIG. 2 is a block diagram of a functional configuration of the LSI test apparatus according to the embodiment.

FIG. 2 is a block diagram of a functional configuration of the LSI test apparatus according to the embodiment. As depicted in FIG. 2, the LSI test apparatus includes a test circuit synthesizing unit 11, a test pattern generating unit 12, a simulating unit 13, and a power supply analyzing unit 14.

The test circuit synthesizing unit 11 inserts a test circuit into a pre-test-synthesis net list. A specific configuration of a circuit generated from a post-test-synthesis net list including the test circuit inserted therein will be described later. The test pattern generating unit 12 generates, based on the post-test-synthesis net list synthesized by the test circuit synthesizing unit 11, a test pattern that simultaneously activates only some of gated clock buffers of an LSI.

The simulating unit 13, using the test pattern generated by the test pattern generating unit 12, simulates operation of a circuit created from the post-test-synthesis net list. The power supply analyzing unit 14 analyzes the amount of voltage drop, based on operation rate information acquired from the simulating unit 13.

When the amount of voltage drop is larger than the voltage drop occurring at the time of system operation of the LSI, the test pattern generating unit 12 changes the number or the rate of gated clock buffers to be simultaneously activated, i.e., changes the activation rate of the gated clock buffers. The test pattern generating unit 12 then generates a test pattern that makes the amount of voltage drop in a high-speed test equal to or less than the amount of voltage drop during system operation.

Respective functions of the test circuit synthesizing unit 11, the test pattern generating unit 12, the simulating unit 13, and the power supply analyzing unit 14, specifically, for example, are implemented by the CPU 101 executing a program recorded on a recording medium such as the ROM 102, the RAM 103, and the HD 105, or through the I/F 109.

Figure 3:
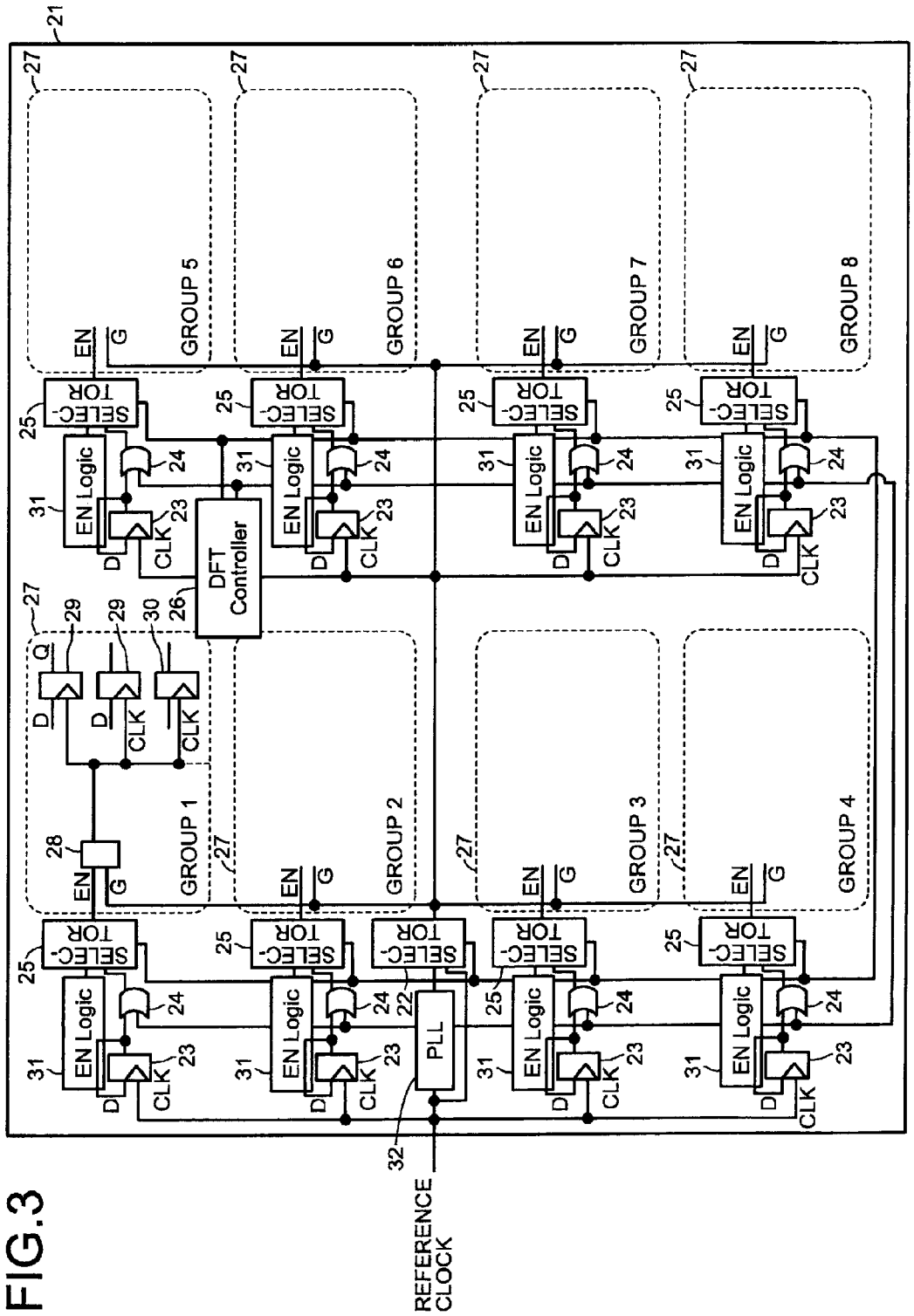
FIG. 3 is a diagram of a first example of a circuit configuration of an LSI after test synthesis by the LSI test apparatus.

FIG. 3 is a diagram of a first example of a circuit configuration of an LSI after test synthesis by the LSI test apparatus according to the embodiment. The circuit configuration of the LSI before test synthesis is identical to the configuration depicted in FIG. 11.

As depicted in FIG. 3, a selector 22 for PLL bypass is incorporated in an overall circuit 21 of the LSI as a result of the test synthesis. A gated clock enable setting flip-flop 23, a mask circuit 24, and a selector 25 are incorporated in each circuit block 27. A DFT controller 26 serving as a test control circuit is also incorporated in the overall circuit 21.

While the number of circuit blocks in the LSI is not limited in particular, the LSI depicted in FIG. 3 includes, for example, eight circuit blocks 27 including a group 1 to a group 8. Each circuit block 27 has, for example, a gated clock buffer 28, and a flip-flop 29 and a memory 30 that are connected to clock output terminals CLK of the gated clock buffer 28 and that operate in synchronization with a clock signal supplied from the gated clock buffer 28.

Flip-flops in the LSI are connected through scan chains. With respect to FIG. 3, for simplicity, block configuration is depicted and described for only the group 1 among the circuit blocks 27. The depiction of block configurations for the groups 2 to 8 among the circuit blocks 27 is omitted.

The DFT controller 26 outputs a test mode signal for controlling the selector 22 for PLL bypass and the selector 25, and further outputs a scan mode signal for controlling the mask circuit 24. Based on the test mode signal, the selector 22 for PLL bypass selects and outputs any one among a reference clock signal and a signal output from a PLL circuit 32. The signal output from the selector 22 for PLL bypass is supplied to a clock input terminal G of the gated clock buffer 28.

The gated clock enable setting flip-flop 23 outputs a signal that is latched to the reference clock by synchronizing the signal with the reference signal. The state (value of retained data) of the gated clock enable setting flip-flop 23 is set when shift operation is performed during a test mode. Based on the scan mode signal, the mask circuit 24 controls the output of the signal from the gated clock enable setting flip-flop 23 to the selector 25. The mask circuit 24 is configured by, for example, an OR-circuit.

Based on the test mode signal, the selector 25 selects any one among the signal output from the mask circuit 24 and the signal output from the enable control circuit 31. The enable control circuit 31 is a circuit that controls a gated clock at the time of system operation. The signal output from the selector 25 is supplied to an enable control terminal EN of the gated clock buffer 28. Operation of the above test circuits will be described.

Figures 4, 5:
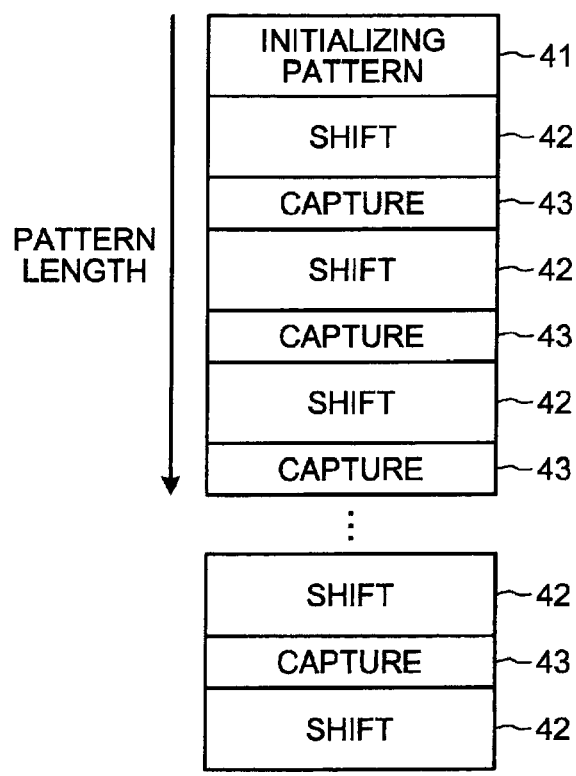
FIG. 4 depicts an example of a truth table for test circuits in the circuit configuration depicted in FIG. 3.
FIG. 5 a schematic of an operation pattern that is executed when a high-speed test is conducted in the circuit configuration depicted in FIG. 3.

FIG. 4 depicts an example of a truth table for the test circuits in the circuit configuration depicted in FIG. 3. In FIG. 4, "FF output", "OR output", and "selector output" represent the signal output from the gated clock enable setting flip-flop 23, the signal output from the mask circuit 24, and the signal output from the selector 25, respectively. "*" indicates that both "0" and "1" are acceptable (similarly indicated in a table depicted in FIG. 7).

As depicted in FIG. 4, for example, the value of the test mode signal is "0" at the time of system operation. In this case, the selector 25 selects the signal output from the enable control circuit 31 and supplies the signal to the enable control terminal EN of the gated clock buffer 28, and the selector 22 for PLL bypass selects the signal output from the PLL circuit 32 and supplies the signal to the clock input terminal G of the gated clock buffer 28.

During the test mode, the value of the test mode signal is "1". In this case, the selector 25 selects the signal output from the mask circuit 24 and the selector 22 for PLL bypass selects the reference clock signal. When shift operation is performed during the test mode, the value of the scan mode signal is "1". At this time, the value of the signal output from the mask circuit 24 is "1" independent of the value of a signal from the gated clock enable setting flip-flop 23; thus, the value of the signal output from the selector 25 becomes "1".

Each gated clock buffer 28 is thus activated, and a clock signal is output from a clock output terminal GCLK of each gated clock buffer 28. When the shift operation is performed, the state (value) of each gated clock enable setting flip-flops 23 and the state (value) of other flip-flops operating at the time of system operation, such as the flip-flops 29 in the circuit blocks 27, is set.

When capture operation is performed during the test mode, the value of the scan mode signal is "0". The mask circuit 24, therefore, outputs the signal from the gated clock enable setting flip-flop 23 as is.

When the value of data retained (value of output signal) in the gated clock enable setting flip-flop 23 is "1", the value of the signal output from the mask circuit 24 is "1" and the value of the signal output from the selector 25 becomes "1". The gated clock buffer 28 connected to the selector 25 outputting the output signal "1" is thus activated to output a clock signal.

Conversely, when the value of data retained (value of output signal) in the gated clock enable setting flip-flop 23 is "0", the value of the signal output from the mask circuit 24 is "0" and the value of the signal output from the selector 25 becomes "0". The gated clock buffer 28 connected to the selector 25 outputting the output signal "0" is not activated and the clock signal is not output. Thus, when capture operation is performed, according to the setting of the gated clock enable setting flip-flop 23 at the time of the shift operation, only some of the circuit blocks 27 are supplied a clock signal and activated.

FIG. 5 a schematic of an operation pattern that is executed when a high-speed test is conducted in the circuit configuration depicted in FIG. 3. As depicted in FIG. 5, the DFT controller 26 is reset using an initializing pattern 41 and a desired test mode is set. Subsequently, a shift operation 42 and a capture operation 43 are repeated. In the shift operation 42, the setting of a gated clock buffer 28 to be activated and of other flip-flops that operate at the time of system operation is performed.

Each circuit block 27 may be activated one at a time or multiple circuit blocks 27 may be simultaneously activated through a pair of the shift operation 42 and the capture operation 43. When multiple circuit blocks 27 are to be activated simultaneously, gated clock buffers 28 that may be simultaneously activated are selected based on layout information so that a large number of gated clock buffers 28 adjacent to each other are not simultaneously activated.

Figure 6:
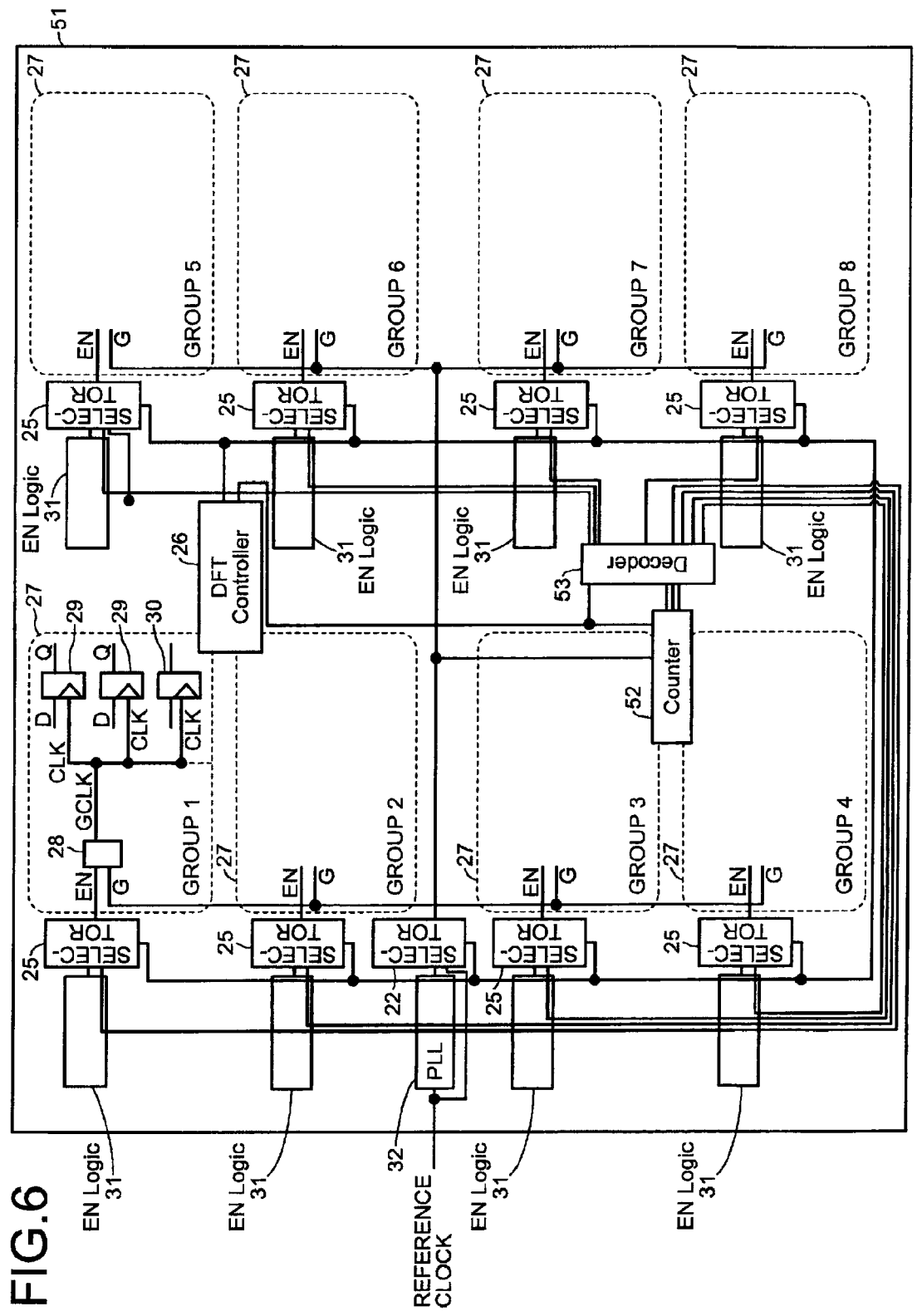
FIG. 6 is a schematic of another example of a circuit configuration of the LSI after test synthesis by the LSI test apparatus.

FIG. 6 is a schematic of another example of a circuit configuration of the LSI after test synthesis by the LSI test apparatus according to the embodiment. Components identical to those of the first example are denoted by the same reference numerals used in the description of the first example, and description therefor will be omitted.

Figure 11:
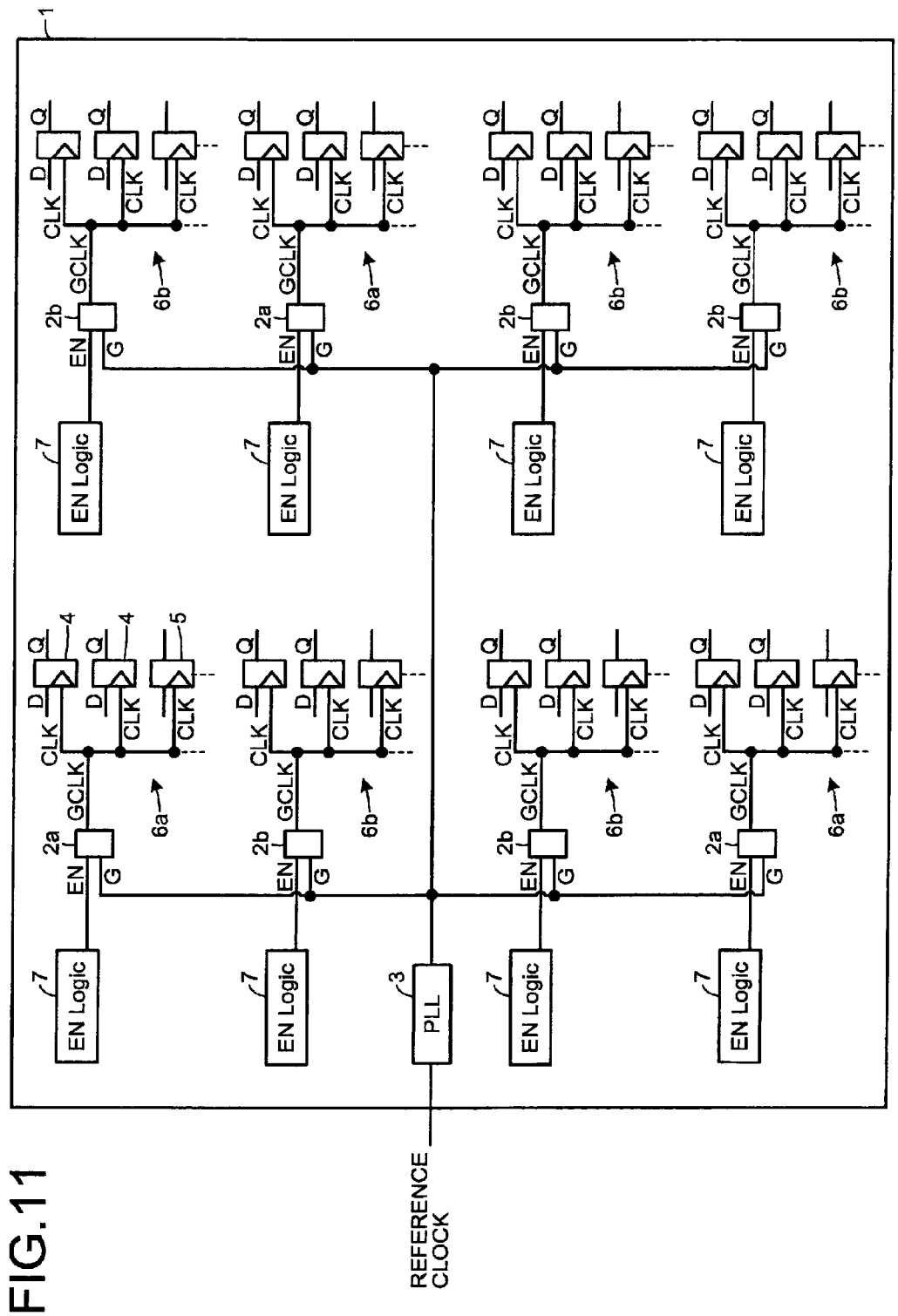
FIG. 11 depicts a circuit configuration of an LSI before test synthesis.
Figure 12:
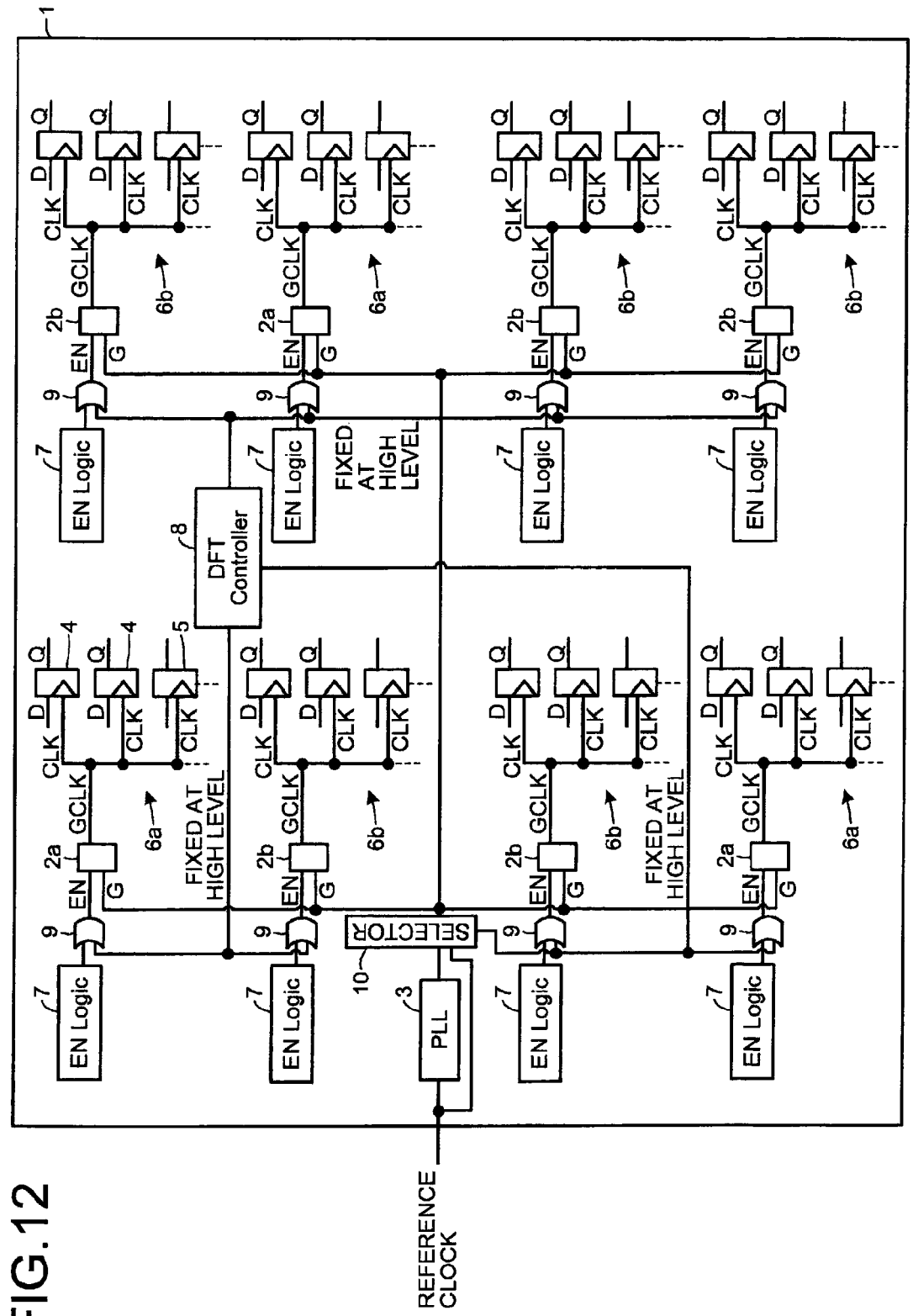
FIG. 12 depicts a circuit configuration of an LSI after test synthesis performed according to a conventional test method.

As depicted in FIG. 6, the LSI circuit configuration depicted in FIG. 11 is subjected to test synthesis to generate an overall circuit 51 of the LSI, in which the selector 22 for PLL bypass and the DFT controller 26 are incorporated, and the selector 25 is incorporated in each circuit block 27. A counter 52 and a decoder 53 are further incorporated in the overall circuit 51.

The DFT controller 26 outputs a scan mode signal for controlling the counter 52 and the decoder 53. The counter 52 is reset by the scan mode signal and updates a counter value based on a reference clock signal output from the selector 22 for PLL bypass.

The decoder 53 decodes, based on the scan mode signal, a counter value output from the counter 52 and according to the decoded counter value, outputs a signal to activate the gated clock buffers 28 in some of the gated clock buffers 28. The decoder 53 further outputs, based on the scan mode signal, a signal to activate all the gated clock buffers 28.

Based on a test mode signal, the selector 25 selects any one among the signal output from the decoder 53 and the signal output from the enable control circuit 31 and outputs the signal selected to the enable control terminal EN of the gated clock buffer 28. The enable control circuit 31 is a circuit that controls a gated clock at the time of system operation. Flip-flops in the LSI are connected through scan chains. The flip-flop constituting the counter 52, however, is not a scan flip-flop. Operation of the above test circuits will be described.

FIG. 7 is a schematic of an example of a truth table for the test circuits in the circuit configuration depicted in FIG. 6. In FIG. 7, "counter output", "decoder output", and "selector output" represent the signal output from the counter 52, the signal output from the decoder 53, and the signal output from the selector 25, respectively.

Because the circuit configuration of FIG. 6 includes eight circuit blocks 27, the signal output from the counter 52 is 3 bits while the signal output from the decoder 53 is 8 bits. The number of bits is, however, properly selected according to the number of circuit blocks 27. The example depicted in FIG. 7 represents a case where the circuit blocks 27 are activated one by one.

As depicted in FIG. 7, for example, the value of the test mode signal is "0" at the time of system operation. In this case, the signals respectively selected by the selector 22 for PLL bypass and the selector 25 are the same as those selected in the first example. During the test mode, the test mode signal is "1". In this case, the selector 22 for PLL bypass selects the reference signal and the selector 25 selects the signal output from the decoder 53.

When shift operation is performed during the test mode, the value of the scan mode signal is "1", which keeps the counter 52 in a reset state, so that the value of the signal output from the counter 52 is "000". Meanwhile, the decoder 53 outputs signals of "1", "1", "1", "1", "1", "1", "1", and "1" to the group 8, the group 7, the group 6, the group 5, the group 4, the group 3, the group 2, and the group 1 circuit blocks 27, respectively. Each of the selectors 25 outputs a signal having a value equivalent to the value of the signal output thereto from the decoder 53.

Each gated clock buffer 28 is thus activated, and a clock signal is output from the clock output terminal GCLK of each gated clock buffer 28. When this shift operation is performed, the state (value) of flip-flops operating at the time of system operation, such as the flip-flops 29 in the circuit blocks 27, is set.

When capture operation is performed during the test mode, the value of the scan mode signal is "0", in which case the counter 52 updates the counter value based on the reference clock signal. When the value of the signal output from the counter 52 is "000", the decoder 53 outputs signals of "0", "0", "0", "0", "0", "0", "0", and "1" to the group 8, the group 7, the group 6, the group 5, the group 4, the group 3, the group 2, and the group 1 circuit blocks 27, respectively.

Each of the selectors 25 outputs a signal having a value equivalent the value of the signal output thereto from the decoder 53. Hence, the gated clock buffer 28 in the group 1 circuit block 27 is activated to output a clock signal and the gated clock buffers 28 in the group 2 to the group 8 circuit blocks 27, which are not activated, do not output a clock signal.

When the value of the signal output from the counter 52 is "001" at the time of capture operation, the decoder 53 outputs signal values of "0", "0", "0", "0", "0", "0", "1", and "0" to the group 8 to the group 1, respectively; thereby activating only the gated clock buffer 28 in the group 2 circuit block 27. The gated clock buffers 28 in the group 3 to the group 8 are each activated in the same manner.

Thus, at the time of capture operation, according to the value output from the counter 52, only some of the circuit blocks 27 are supplied a clock signal and activated. The decoder 53 may be configured so that multiple gated block buffers 28 are simultaneously activated, in which case gated clock buffers 28 that may be simultaneously activated are selected based on layout information to prevent simultaneous activation of a large number of gated clock buffers 28 adjacent to each other.

Figure 8:
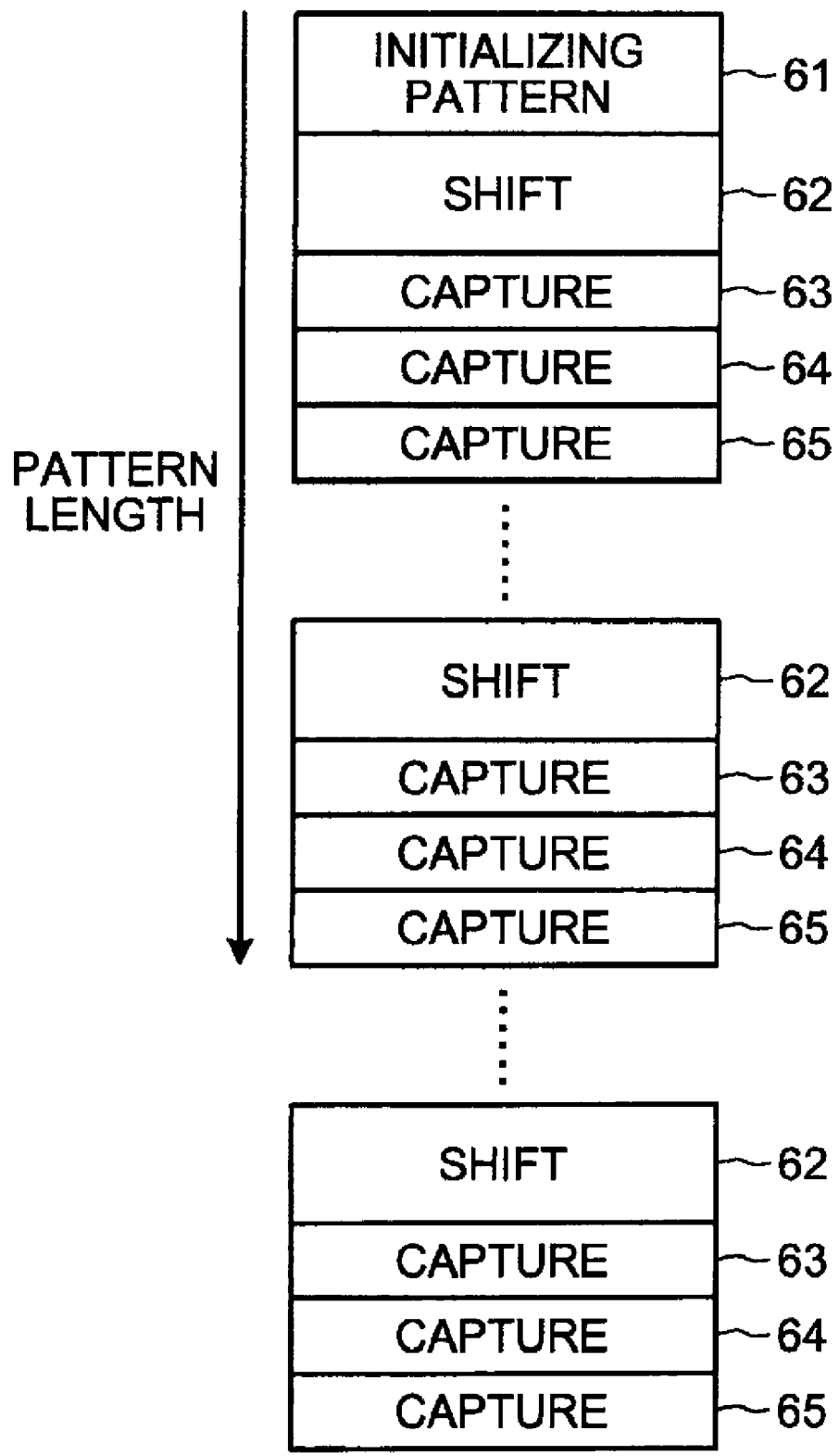
FIG. 8 is a schematic of an operation pattern that is executed when a high-speed test is conducted in the circuit configuration depicted in FIG. 6.

FIG. 8 is a schematic of an operation pattern that is executed when a high-speed test is conducted in the circuit configuration depicted in FIG. 6. As depicted in FIG. 8, the DFT controller 26 is reset using an initializing pattern 61 and a desired test mode is set. Subsequently, a shift operation 62 is performed to set flip-flops. In this state, capture operations 63, 64, and 65 are repeated until all gated clock buffers 28 are activated. In each of the capture operations 63, 64, and 65, a gated clock buffer 28 to be activated is selected by the counter 52 and the decoder 53.

Figure 9:
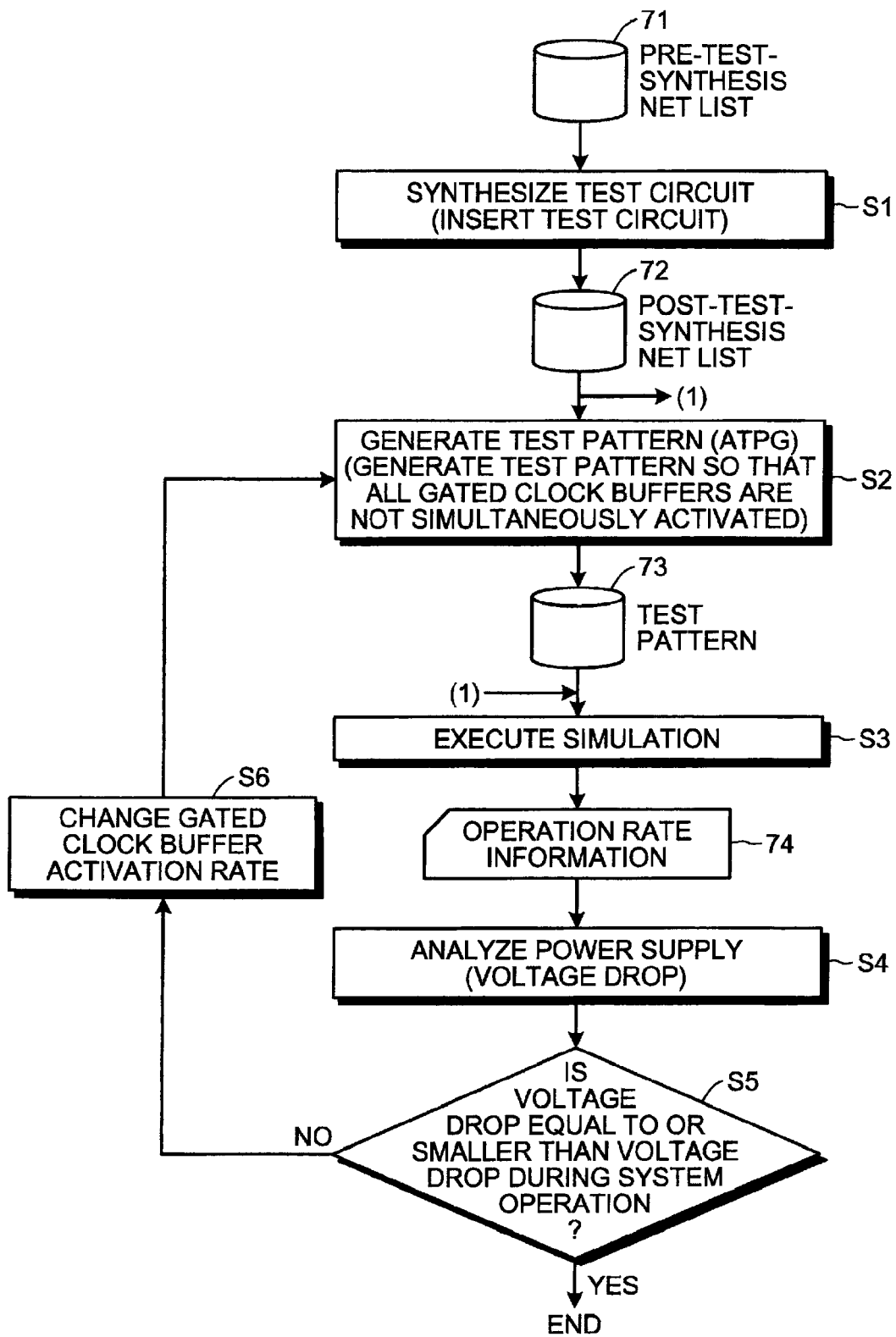
FIG. 9 is a flowchart of a first example of a high-speed test procedure performed by the LSI test apparatus.

FIG. 9 is a flowchart of a first example of a high-speed test procedure performed by the LSI test apparatus according to the embodiment.

As depicted in FIG. 9, the test circuit synthesizing unit 11 synthesizes a test circuit (step S1), which is inserted in the pre-test-synthesis net list 71. At this time, a user may specify a gated clock buffer 28 to control.

For example, in the case of the circuit configuration depicted in FIG. 3, the selector 22 for PLL bypass, the gated clock enable setting flip-flop 23, the mask circuit 24, the selector 25, and the DFT controller 26 are incorporated as test circuits. In the case of the circuit configuration depicted in FIG. 6, the selector 22 for PLL bypass, the selector 25, the DFT controller 26, the counter 52, and the decoder 53 are incorporated as test circuits.

The test pattern generating unit 12 generates a test pattern 73 (step S2), which is automatically generated based on a post-test-synthesis net list 72 acquired when the test circuit is synthesized. The test pattern 73 is a pattern that does not enable simultaneous activation of all the gated block buffers 28.

The simulating unit 13, using the test pattern 73, executes a simulation of high-speed operation of a circuit generated from the post-test-synthesis net list 72 (step S3). Subsequently, the power supply analyzing unit 14 executes power supply analysis (step S4), in which the amount of voltage drop is analyzed base on operation rate information 74 acquired at the simulation.

Based on the results of the power supply analysis, it is determined whether a voltage drop during a test mode is at most the voltage drop during system operation (step S5). If the voltage drop during the test mode at most the voltage drop during the system operation (step S5: YES), a series of processing according to the flowchart ends.

If the voltage drop during the test mode exceeds the voltage drop during the system operation (step S5: NO), the test pattern generating unit 12 changes the gated clock buffer activation rate (step S6), where the number or the rate of gated clock buffers 28 to be simultaneously activated is changed.

Subsequently, the flow returns to the generation of a test pattern at step S2. This cycle of processing is repeated until the voltage drop during the test mode becomes equal to or less than the voltage drop during the system operation. According to the first example, a high-speed test can be performed even without layout information 76.

Figure 10:
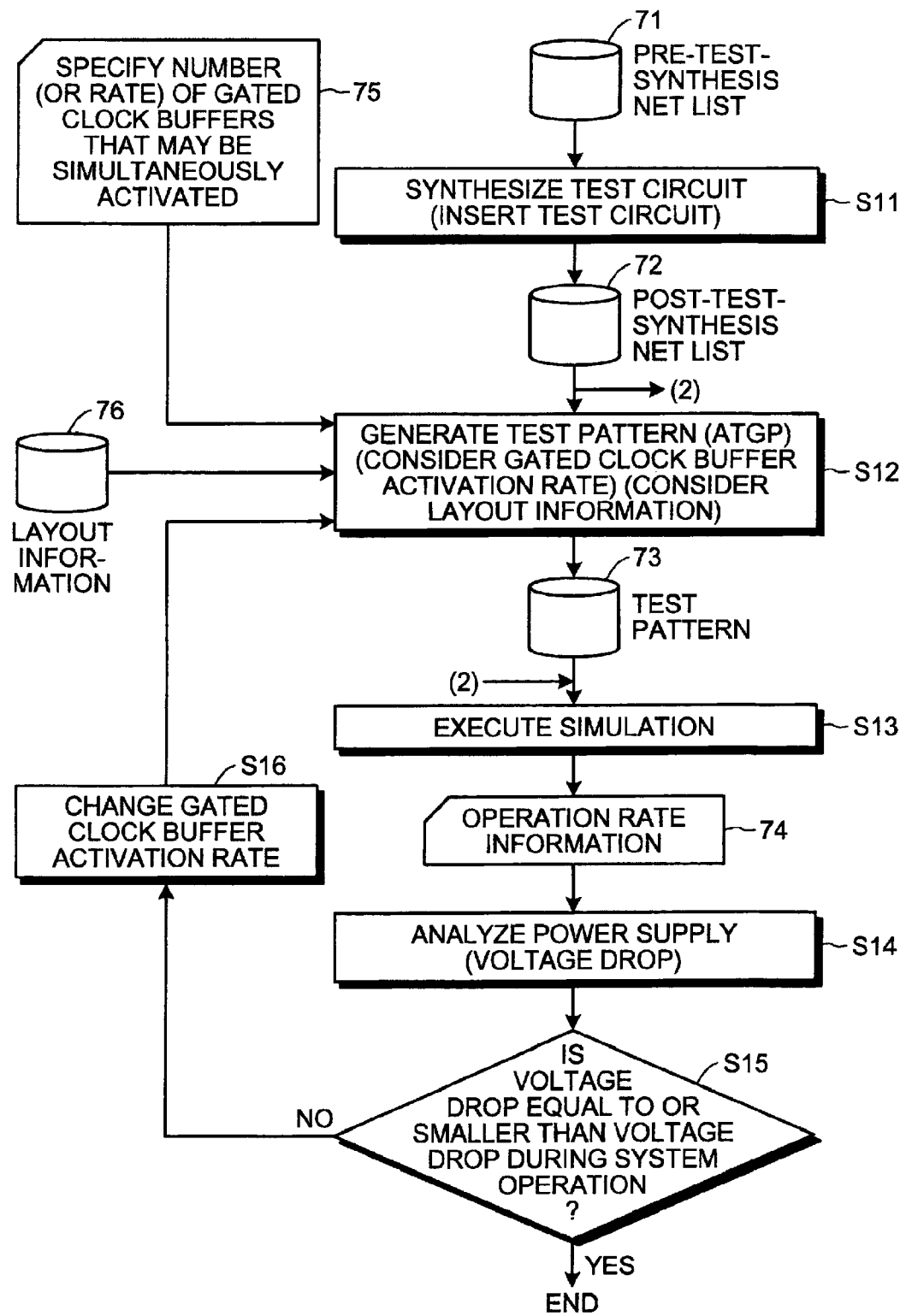
FIG. 10 is a flowchart of a second example of a high-speed test procedure performed by the LSI test apparatus.

FIG. 10 is a flowchart of a second example of a high-speed test procedure performed by the LSI test apparatus according to the embodiment. As depicted in FIG. 10, in the second example, the number (or rate) of gated clock buffers that may be simultaneously activated 75 is specified.

The test circuit synthesizing unit 11 synthesizes a test circuit (step S11) to acquire the post-test-synthesis net list 72 by inserting the test circuit in the pre-test-synthesis net list 71. This process flow is the same as the process flow according to the first example. Subsequently, the test pattern generating unit 12 automatically generates the test pattern 73 while considering the number (or rate) of gated clock buffers that may be simultaneously activated 75 (step S12).

At the generation of the test pattern 73, the layout information 76 is checked to select gated clock buffers 28 to be simultaneously activated so that circuit blocks 27 to be operated simultaneously do not concentrate locally. Subsequently, the simulation by the simulating unit 13 (step S13), the power supply analysis using the operation rate information 74 by the power supply analyzing unit 14 (step S14), and the determination of whether the voltage drop during the test mode at most the voltage drop during system operation (step S15) are executed sequentially in the same manner as described with respect to the first example.

Based on the result at the determination, a series of processing according to the flowchart ends, or the gated clock buffer activation rate is changed by the test pattern generating unit 12 (step S16) and the flow returns to return to the test pattern generation at step S12. According to the second example, multiple circuit blocks 27 may be operated simultaneously; thereby making the test pattern generated according to the second example shorter than the test pattern generated according to the first example.

As described, according to the embodiment, a test pattern for simultaneously activating only some of the gated clock buffers 28 is generated when a high-speed test is conducted on the LSI. By using this test pattern, the amount of voltage drop in the high-speed test is reduced to be equal to or less than the amount of voltage drop during system operation; thereby preventing such problems as the LSI being determined to be defective because power consumption in a test exceeds power consumption during system operation and enabling trouble-free implementation of the high-speed test.

The LSI test method explained in the present embodiment may be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An LSI test apparatus comprising:
a test circuit synthesizing unit that synthesizes a test circuit and inserts the test circuit in a pre-test-synthesis net list;
a test pattern generating unit that, based on a post-test-synthesis net list acquired by the test circuit synthesizing unit, generates a test pattern that simultaneously activates selected gated clock buffers;
a simulating unit that, using the test pattern generated by the test pattern generating unit, simulates operation of a circuit created from the post-test-synthesis net list; and
a power source analyzing unit that analyzes voltage drop in terms of amount, based on operation rate information acquired by the simulating unit.

2. An LSI test method comprising:
synthesizing a test circuit and inserting the test circuit in a pre-test-synthesis net list;
generating, based on a post-test-synthesis net list acquired at synthesizing, a test pattern that simultaneously activates selected gated clock buffers;
simulating, using the test pattern generated at the generating, operation of a circuit created from the post-test-synthesis net list; and
analyzing voltage drop in terms of amount, based on operation rate information acquired at the simulating.

3. The LSI test method according to claim 2, further comprising changing an activation rate of gated clock buffers so that the amount of voltage drop acquired at the analyzing becomes at most the amount of voltage drop during system operation.

4. The LSI test method according to claim 2, wherein
the generating includes generating the test pattern based on a number of gated clock buffers that may be simultaneously activated.

5. The LSI test method according to claim 2, wherein
the generating includes generating the test pattern based on a rate of gated clock buffers that may be simultaneously activated.

6. The LSI test method according to claim 4, wherein
the generating includes selecting, based on layout information, gated clock buffers that may be simultaneously activated.

7. The LSI test method according to claim 5, wherein
the generating includes selecting, based on layout information, gated clock buffers that may be simultaneously activated.

8. The LSI test method according to claim 2, wherein
the synthesizing includes inserting a selector for PLL bypass, a gated clock enable setting flip-flop, a mask circuit, a selector, and a test control circuit as test circuits,
the selector for PLL bypass, based on a test mode signal output from the test control circuit, supplies a reference clock signal to a clock terminal of a gated clock buffer during a test mode,
the gated clock enable setting flip-flop outputs a signal that is latched to the reference clock by synchronizing the signal with the reference signal,
the mask circuit, based on a scan mode signal output from the test control circuit, controls output of the signal output from the gated clock enable setting flip-flop to the selector, and
the selector, based on the test mode signal output from the test control circuit, supplies the signal output from the mask circuit to an enable control terminal of the gated clock buffer during the test mode.

9. The LSI test method according to claim 2, wherein
the generating includes inserting a selector for PLL bypass, a counter, a decoder, a selector, and a test control circuit as test circuits,
the selector for PLL bypass, based on a test mode signal output from the test control circuit, supplies a reference clock signal to the counter and a clock terminal of a gated clock buffer during a test mode,
the counter, based on the reference clock signal output from the selector for the PLL bypass, updates a counter value,
the decoder decodes the counter value output from the counter, and
the selector, based on the test mode signal output from the test control circuit, supplies the signal output from the decoder to an enable control terminal of the gated clock buffer during the test mode.

10. A computer-readable recording medium storing therein an LSI test program that causes a computer to execute:
synthesizing a test circuit and inserting the test circuit in a pre-test-synthesis net list;
generating, based on a post-test-synthesis net list acquired at synthesizing, a test pattern that simultaneously activates selected gated clock buffers;
simulating, using the test pattern generated at the generating, operation of a circuit created from the post-test-synthesis net list; and
analyzing voltage drop in terms of amount, based on operation rate information acquired at the simulating.

* * * * *